United States Patent
Hase (10) Patent No.: US 7,067,858 B2
(45) Date of Patent: *Jun. 27, 2006

(54) HETEROJUNCTION BIPOLAR TRANSISTOR WITH A BASE LAYER THAT CONTAINS BISMUTH

(75) Inventor: Ichiro Hase, Kanagawa (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/194,600

(22) Filed: Aug. 2, 2005

(65) Prior Publication Data

US 2005/0263792 A1   Dec. 1, 2005

Related U.S. Application Data

(60) Division of application No. 11/050,810, filed on Jan. 27, 2005, now Pat. No. 7,009,225, which is a continuation of application No. 10/626,526, filed on Jul. 25, 2003, now Pat. No. 6,936,871.

(30) Foreign Application Priority Data

Aug. 2, 2002   (JP) .............................. 2002-225631

(51) Int. Cl.
H01L 29/73   (2006.01)

(52) U.S. Cl. ...................................... 257/198
(58) Field of Classification Search ................. 257/198
See application file for complete search history.

(56) References Cited

U.S. PATENT DOCUMENTS

| 4,847,666 A | 7/1989 | Heremans et al. |
| 5,565,370 A | 10/1996 | Jerome et al. |
| 6,417,058 B1 | 7/2002 | Richardson et al. |
| 6,815,736 B1 * | 11/2004 | Mascarenhas ............... 257/201 |

FOREIGN PATENT DOCUMENTS

JP   2002-134524 A   5/2002

* cited by examiner

*Primary Examiner*—Stephen W. Smoot
(74) *Attorney, Agent, or Firm*—Rader, Fishman & Grauer PLLC; Ronald P. Kananen (57) ABSTRACT

A heterojunction bipolar transistor (HBT) with improved characteristics is provided. A III–V compound semiconductor having Bi added thereto is used for a base layer of a GaAs-based or InP-based HBT. For example, a GaAs-based HBT is formed by successively stacking a subcollector layer made of $n^+$-GaAs, a collector layer made of $n^-$-GaAs, a base layer made of $p^+$-GaAsBi, an emitter layer made of n-InGaP, a first cap layer made of n-GaAs, and a second cap layer made of $n^+$-InGaAs on a substrate 1 made of single crystal GaAs.

1 Claim, 8 Drawing Sheets

PRIOR ART

FIG. 7

PRIOR ART

FIG. 8

HETEROJUNCTION BIPOLAR TRANSISTOR WITH A BASE LAYER THAT CONTAINS BISMUTH

CROSS REFERENCE TO RELATED APPLICATION

This application is a divisional of application Ser. No. 11/050,810, filed Jan. 27, 2005, U.S. Pat. No. 7,009,225 which is a continuation of application Ser. No. 10/626,526, filed Jul. 25, 2003U.S. Pat. No. 6,936,871. This application claims priority from Japanese Priority Document No. 2002-225631, filed on Aug. 2, 2002 with the Japanese Patent Office, which document is hereby incorporated by reference.

BACKGROUND OF THE INVENTION

1. Field of the Invention

The present invention relates generally to a semiconductor device, and more particularly, to a heterojunction bipolar transistor.

2. Description of Related Art

A heterojunction bipolar transistor (hereinafter referred to as a HBT) is a kind of bipolar transistor having an emitter layer made of a material with a wider band gap than a material of a base layer, in which high injection efficiency (emitter injection efficiency) of electrons from the emitter layer to the base layer can be assured even when the base layer has an impurity concentration higher than the emitter layer. Thus, the base layer can have low resistance even with a reduced thickness, and a punch-through phenomenon across the base layer can be prevented to ensure a high emitter-collector breakdown voltage. Basically, the HBT is an excellent device which achieves fast operation and the high breakdown voltage.

The HBT is favorable for use as a device for a power amplifier (hereinafter referred to as a PA) due to high current drive capability. In addition, because of the advantage that the HBT readily operates with a single power source, it has been widely used for a PA in a mobile communication terminal in recent years.

Power-Added Efficiency (hereinafter referred to as a PAE) is known as an indicator for indicating efficiency in a power amplifier. PAE is defined as a ratio of additional power, that is, a difference between an output power $P_{out}$ and an input power $P_{in}$ to an applied direct current power $P_{dc}$. As the PAE is greater, the power consumption of the power amplifier can be smaller. Thus, the PAE an important indicator in the power amplifier. This is particularly important in a mobile communication terminal in which power consumption of a power amplifier (PA) on the transmitter side makes up a significant portion of the overall power consumption.

Figure 7:
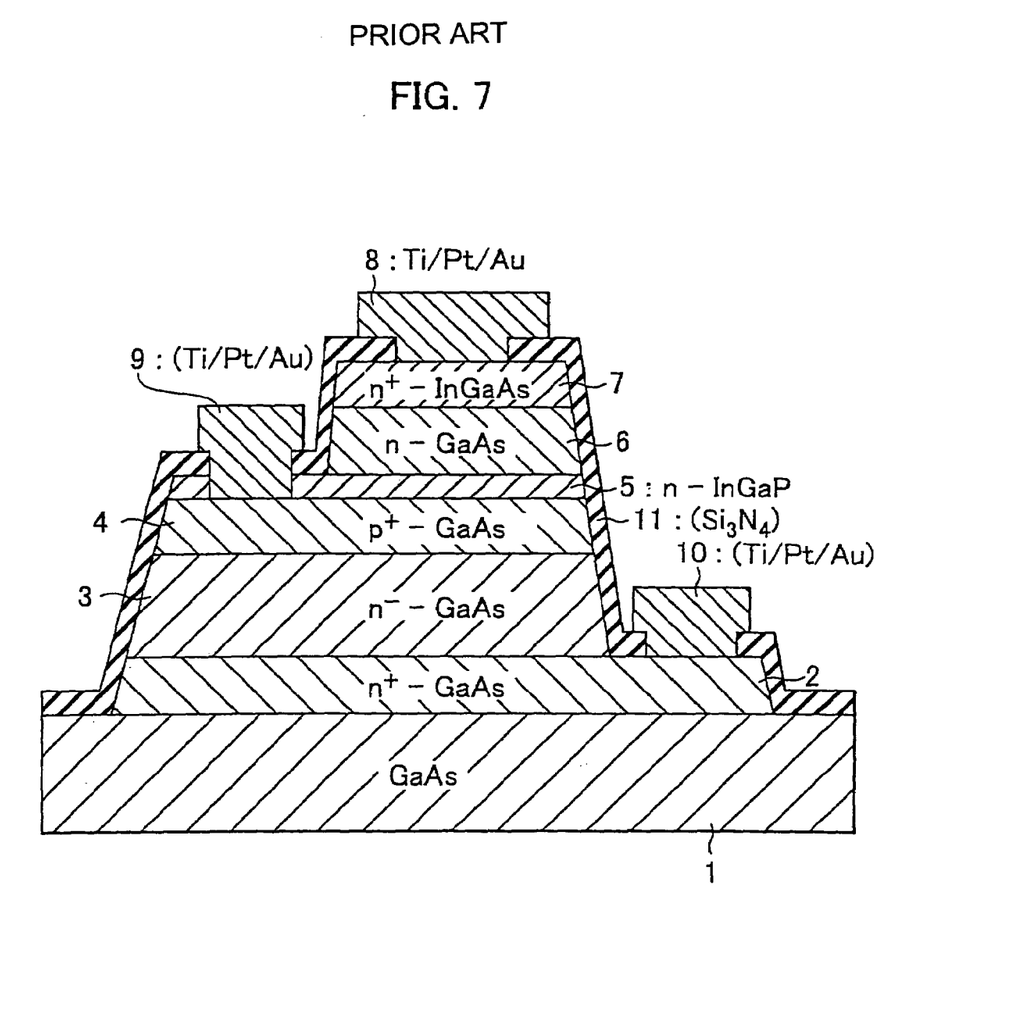
FIG. 7 is a sectional view showing a conventional GaAs-based HBT.

FIG. 7 shows an exemplary configuration of a conventional GaAs-based HBT. This semiconductor device includes a subcollector layer 2, made of, for example, n$^+$-GaAs, a collector layer 3 made of n$^-$-GaAs, a base layer 4 made of p$^+$-GaAs, an emitter layer 5, made of, for example, n-InGaP, a first cap layer 6 made of n-GaAs, and a second cap layer 7 made of n$^+$-InGaAs, which are successively stacked on one surface of a substrate 1, made of, for example, semi-insulating single crystal GaAs. An emitter electrode 8 is formed on the second cap layer 7. Mesa structures are formed for forming ohmic contact with the base and the collector such that a base electrode 9 and a collector electrode 10 are in contact with portions of the base layer 4 and the subcollector layer 2, respectively. These electrodes are made of Ti/Pt/Au, for example. The surface of the semiconductor device that is not in contact with any of the electrodes is covered with an insulating film 11, made of, for example, Si$_3$N$_4$.

Figure 8:
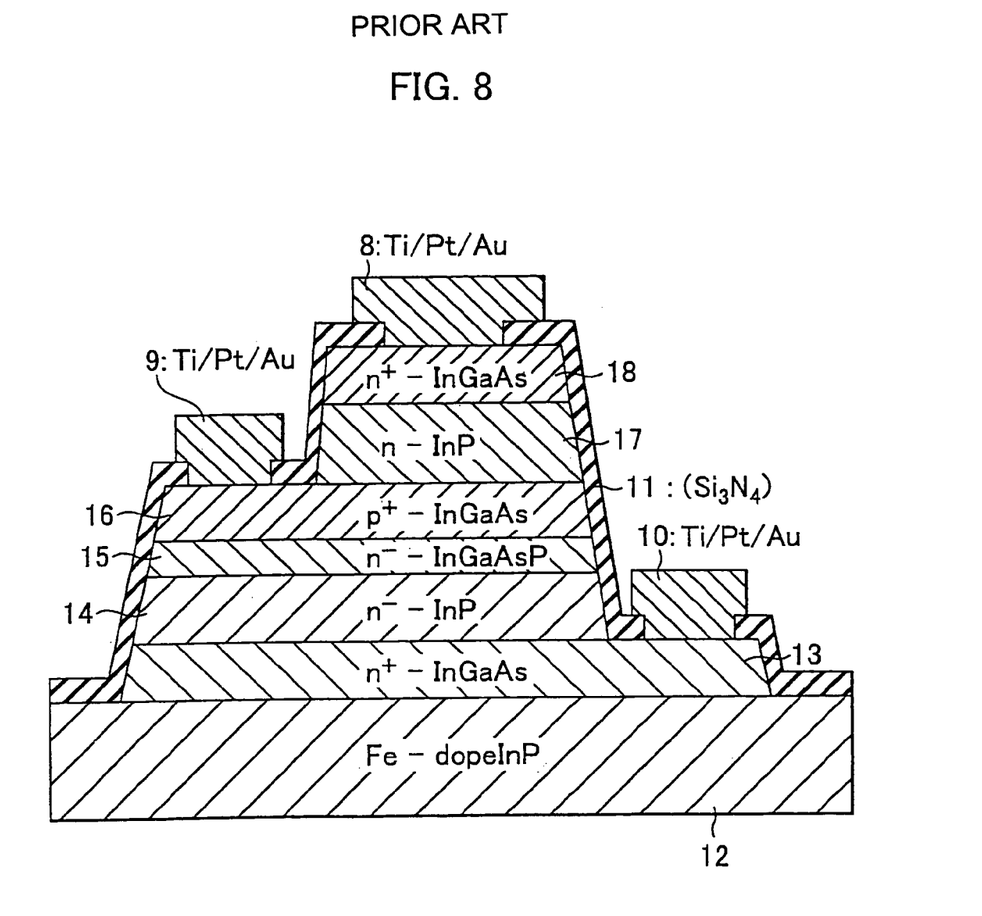
FIG. 8 is a sectional view showing a conventional InP-based HBT.

FIG. 8 shows an exemplary configuration of a. conventional InP-based HBT. This semiconductor device includes a subcollector layer 13, made of, for example, n$^+$-InGaAs, a second collector layer 14 made of n$^-$-InP, a first collector layer 15 made of n$^-$-InGaAsP, a base layer 16 made of p$^+$-InGaAs, an emitter layer 17, made of, for example, n-InP, and a cap layer 18 made of n$^+$-InGaAs, which are successively stacked on one surface of a substrate 12, made of, for example, semi-insulating single crystal InP. An emitter electrode 8 is formed on the cap layer 18. Mesa structures are formed for forming ohmic contact with the base and the collector such that a base electrode 9 and a collector electrode 10 are in contact with portions of the base layer 16 and the subcollector layer 13, respectively. These electrodes are made of Ti/Pt/Au, for example. The surface of the semiconductor device that is not in contact with any of the electrodes is covered with an insulating film 11, made of, for example, Si$_3$N$_4$.

In FIG. 8, InGaAs can be used for the collector layer, but InGaAs has a narrow band gap and thus the base-collector breakdown voltage is reduced. FIG. 8 shows an example of a double heterojunction bipolar transistor (hereinafter referred to as a DHBT) which employs InP in the collector layer for ensuring a higher breakdown voltage. In the DHBT, a conduction-band offset ΔEc occurs between the InGaAs base layer and the InP collector layer to block current from the base layer to the collector layer. Thus, the InGaAsP layer is inserted as the first collector layer 15 between the InP collector layer and the InGaAs base layer to reduce the influence of the potential discontinuity found between the InGaAs base layer and the InP collector layer. For the first collector layer, AlInGaAs or undoped InGaAs may be used.

When the HBT is used to form a power amplifier, one of the requirements for a device to improve the PAE is a reduction in a Knee voltage $V_k$ in $I_c$–$V_{ce}$ characteristics. Reducing the Knee voltage $V_k$ requires a reduction in offset voltage $V_{offset}$ which is a threshold voltage of $I_c$ in the $I_c$–$V_{ce}$ characteristics. The offset voltage $V_{offset}$ is almost determined by a difference between a forward threshold voltage $V_{teb}$ between an emitter and a base and a forward threshold voltage $V_{tbc}$ between the base and a collector ($V_{teb}$—$V_{tbc}$). Thus, a conduction-band offset ΔEc produced between an emitter layer and a base layer can desirably be as small as possible.

A frequently used approach for reducing the influence of the conduction-band offset ΔEc is to insert a graded heterojunction, which gradually changes in composition, between the emitter layer and the base layer. However, the graded heterojunction is not necessarily made easily with favorable controllability and reproducibility, and a thick graded layer is needed to eliminate the influence of the conduction-band offset ΔEc and so that holes are not confined completely within the base layer, so that it is desirable to reduce the offset voltage $V_{offset}$ by lowering the offset voltage ΔEc. It goes without saying that, in the HBT, a valence-band offset ΔEv of the emitter layer and the base layer needs to be large enough to sufficiently block the holes.

In the GaAs-based HBT shown in FIG. 7, an offset voltage ΔEc between InGaP serving as the emitter layer and GaAs serving as the base layer is approximately 0.2 eV. In the InP-based HBT shown in FIG. 8, an offset voltage ΔEc between InP serving as the emitter layer and InGaAs serving as the base layer is approximately 0.2 eV. The values are not excessively high, but a smaller value is desirable.

From the viewpoint of improvement in basic performance of the HBT, a reduction in base resistance is an important challenge. When the base resistance is high, some disadvantages occur such as a reduction in the maximum oscillation frequency $f_{max}$ and uneven voltage applied between the emitter and the base (emitter crowding) in areas where the current density is high. Thus, the base resistance is desirably reduced as much as possible from the viewpoint of application to a power amplifier.

To reduce the base resistance, the base layer is typically doped at a high concentration to reduce base sheet resistance and base contact resistance. The doping concentration, however, cannot be increased without limitation since the doping concentration has an upper limit and an extremely high doping concentration causes problems such as a reduced current gain and reduced carrier mobility.

As a material of the base layer of the GaAs-based HBT as shown in FIG. 7, a GaAs-based material is typically used. In recent years, C (carbon) is often used as a p-type impurity with less diffusion. The base layer can be doped with C at $10^{19}$ cm$^{-3}$ or higher, but in this case the mobility is as small as approximately 50 cm$^2$/(v·s) or lower.

In the InP-based HBT as shown in FIG. 8, InGaAs is typically used for the base layer. C (carbon) tends to be amphoteric in InGaAs, and the concentration of the p-type impurity cannot be as high as the concentration in the GaAs-based HBT. For this reason, the base sheet resistance is usually higher than in a GaAs-based HBT having the same base layer thickness.

Therefore, to ensure performance equal to or higher than that provided by the currently dominant GaAs-based HBT and InP-based HBT, it is desirable that doping be performed at a concentration that is at least the same level as for the GaAs-based HBT, or that the base layer presents higher hole mobility than in the GaAs-based HBT.

SUMMARY OF THE INVENTION

The present invention has been made in view of the above-recited problems to be solved to provide higher efficiency when an HBT is used as a device for a PA and to provide improved basic performance of the HBT, such as reduced base resistance. There is a need to provide a semiconductor device that achieves improved PA characteristics over the conventional PA using GaAs-based HBT or InP-based HBT.

According to an embodiment of the present invention, a semiconductor device comprises an emitter layer, a base layer, and a collector layer, the sum of a band gap and electron affinity of the emitter layer being larger than the sum of a band gap and electron affinity of the base layer, wherein the base layer contains Bi.

In the present invention, materials of the base containing Bi include, for example, GaAsBi, GaAsBiN, and InPBi. In such a III–V compound semiconductor, the energy level is raised at the valence band edge by adding Bi, and hole mobility is increased. The raised energy level at the valence band edge reduces the Schottky barrier for the base layer to allow a reduction in base contact resistance. The increased hole mobility can reduce base sheet resistance. In addition, the raised energy level at the valence band edge can cause a greater difference in energy at the valence band edges of the emitter layer and the base layer to enhance the effect of confining holes in the base layer. Thus, the use of the base layer containing Bi can improve the basic performance of an HBT.

Since the addition of Bi raises the energy level at the valence band edge of the base layer to make a greater difference in energy at the valence band edges of the emitter layer and the base layer, an emitter layer with a lower energy at the conduction band edge can be selected. Consequently, it is possible to reduce the difference in energy at the conduction band edges of the emitter layer and the base layer. This can reduce the Knee voltage Vk to improve the PAE of a power amplifier for which the semiconductor device according to the present invention is used.

For the emitter layer, GaAs, AlGaAs, InGaP, InP or the like is used, by way of example. For the collector layer, GaAs, InGaAs, InP or the like is used, by way of example.

According to another embodiment of the present invention, the amount of Bi contained in a base layer increases from the emitter side toward the collector side. In the embodiment, a potential gradient for accelerating movement of electrons is formed in the base layer to allow improvement in moving speed of the electrons from the base layer to the collector layer.

According to an embodiment of the present invention, the addition of Bi to the material of the base layer can reduce the base resistance to improve the basic performance of the HBT. It is also possible to use the emitter layer with energy at the conduction band edge that is slightly different from that of the base layer. Thus, the Knee voltage Vk can be reduced to enhance the efficiency of a power amplifier for which the semiconductor device according to the present invention is used.

According to another embodiment of the present invention, the use of GaAsBi for the base layer can reduce the base resistance of a GaAs-based or InP-based HBT. In addition, a combination of the base layer and the emitter layer with low energy at the conduction band edge can reduce a conduction-band offset ΔEc at the interface between the emitter and the base to lower the Knee voltage Vk, thereby contributing to higher efficiency of a power amplifier for which the semiconductor device according to the present invention is used. Since the InP-based HBT has energy at the conduction band edge higher than in a typical InGaAs base, a conduction-band offset ΔEc at the interface between the emitter and the base can be reduced to lower the Knee voltage Vk.

According to another embodiment of the present invention, the use of GaAsBiN for the base layer can provide effects similar to those of GaAsBi. In a GaAs-based HBT, lattice matching to GaAs of the collector layer can be achieved.

According to another embodiment of the present invention, the use of InPBi for the base layer can realize an InP-based HBT with a more simplified configuration and reduce the Knee voltage Vk to contribute to higher efficiency of a PA for which the semiconductor device according to the present invention is used.

DESCRIPTION OF THE PREFERRED EMBODIMENTS

Preferred embodiments of the present invention will be hereinafter described with reference to the drawings.

(First Embodiment)

Figure 1:
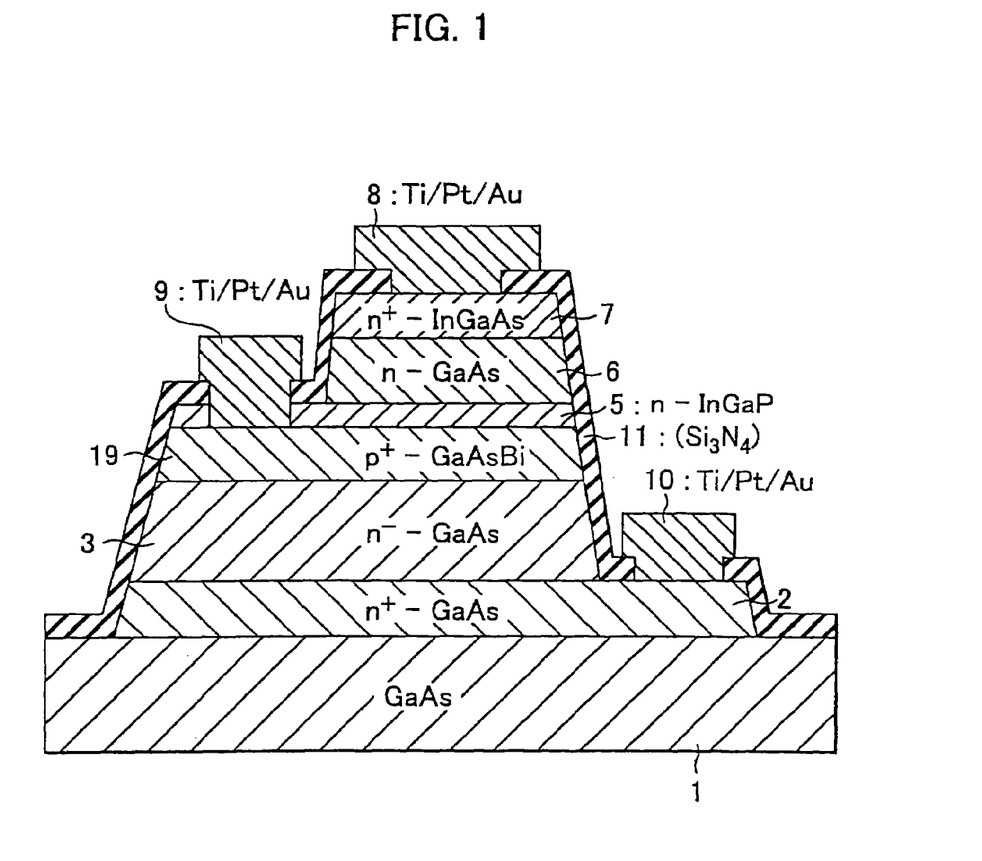
FIG. 1 is a sectional view showing a semiconductor device according to a first embodiment of the present invention.

FIG. 1 shows a semiconductor device according to a first embodiment of the present invention. GaAsBi is used for a base layer, and the remaining configuration is the same as the configuration shown in FIG. 7. In FIG. 1, components identical to those in FIG. 7 are designated with the same reference numerals.

As shown in FIG. 1, the semiconductor device according to the first embodiment includes a subcollector layer 2, made of, for example, $n^+$-GaAs, a collector layer 3 made of $n^-$-GaAs, a base layer 19 made of $p^+$-GaAsBi, an emitter layer 5, made of, for example, n-InGaP, a first cap layer 6 made of n-GaAs, and a second cap layer 7 made of $n^+$-InGaAs, which are successively stacked on a substrate 1, made of, for example, semi-insulating single crystal GaAs.

An emitter electrode 8 is formed on the second cap layer 7. For forming a base contact, portions of the first and second cap layers are removed to form a mesa structure. The emitter layer 5 may be interposed between a base electrode 9 and the base layer 19. Alternatively, only the portion of the emitter layer 5 immediately below the base electrode 9 or nearby portions may be etched and removed such that the base electrode 9 is in direct contact with the base layer 19. A mesa structure is also formed for forming a collector electrode 10. The collector electrode 10 is formed on the subcollector layer 2. The emitter electrode 8, the base electrode 9, and the collector electrode 10 are formed of Ti/Pt/Au, for example. The surface of the semiconductor device that is not in contact with any of the electrodes is covered with an insulating film 11, made of, for example, $Si_3N_4$.

In the configuration described above, GaAsBi is used for the base layer 19. This is because, typically in III–V compound semiconductors, as the atomic number of a Group V element is larger, the energy level at the valence band edge is higher (for example, see A.P.L. Vol. 60, No. 5, p. 631 describing the relationship between the band edge and lattice constant in various semiconductors), and hole mobility tends to be higher (for example, see Appendix of Compound Semiconductor Device Physics By Tiwari). Thus, firstly, the Schottky barrier for the p-type semiconductor is lowered to easily reduce the base contact resistance. Secondly, the hole mobility can be increased to readily reduce the sheet resistance of the base. Thirdly, the difference in energy at the valence band edges of the base layer and the emitter layer can be increased to enhance the effect of confining holes in the base layer. Fourthly, Ga is used as a Group III element, so that the energy level at the conduction band edge of the base layer is less prone to be affected significantly even when the base layer includes the Group V element, Bi, added thereto. In other words, the base layer made of GaAsBi is advantageous since a potential barrier which blocks current between the base and the collector is unlikely to be formed as compared with the case where the base layer is made of InGaAs containing the Group III element, In, added thereto. However, a mismatch occurs in this configuration between the lattice constants of GaAsBi and GaAs of the collector layer 3, so that the thickness of the GaAsBi layer (the base layer 19) must be set to be equal to or smaller than the critical thickness. As a result, the applicability is somewhat limited.

As is apparent from the above description, according to the first embodiment, the base resistance can be reduced to enhance the basic performance of the HBT as compared with the conventional GaAs-based HBT shown in FIG. 7.

(Second Embodiment)

Figure 2:
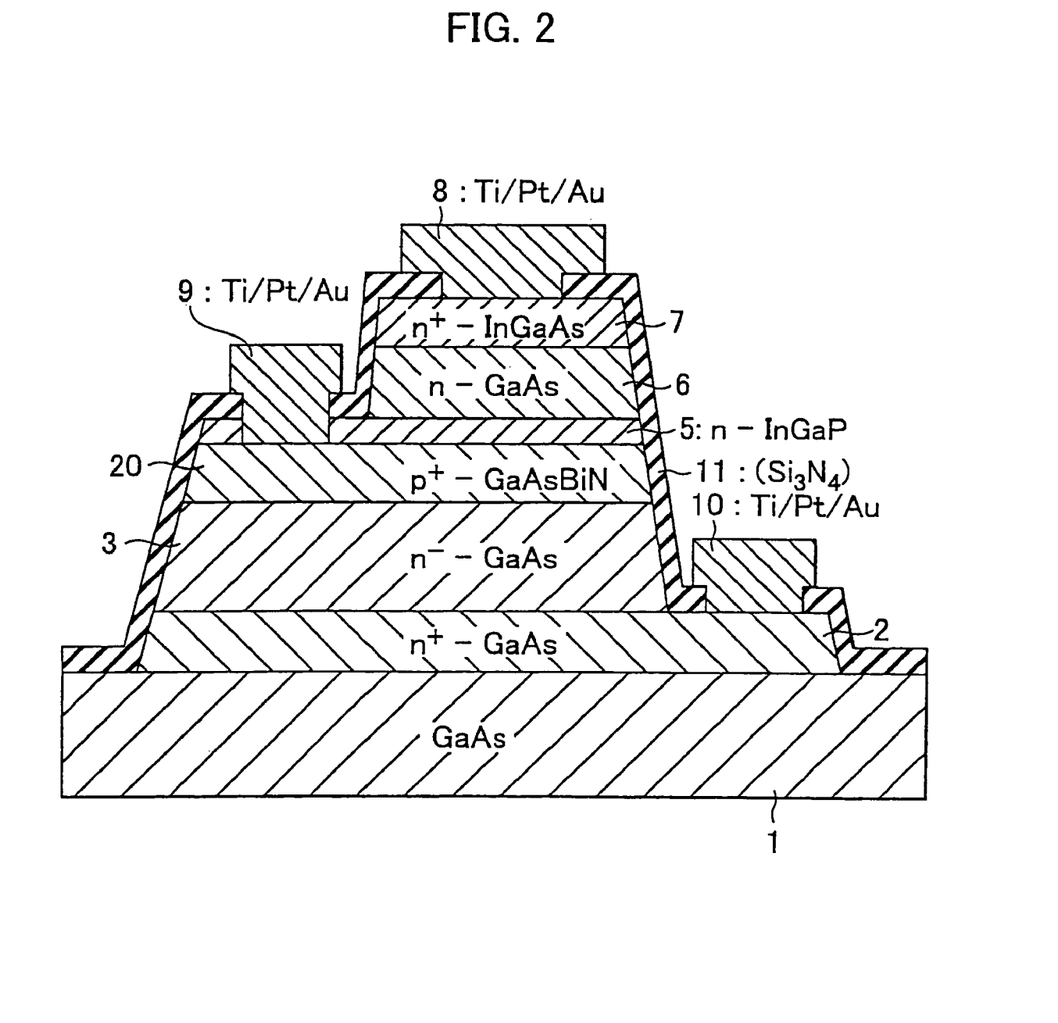
FIG. 2 is a sectional view showing a semiconductor device according to a second embodiment of the present invention.

FIG. 2 shows a semiconductor device according to a second embodiment of the present invention, in which GaAsBiN is used for a base layer. Specifically, the second embodiment differs from the first embodiment shown in FIG. 1 in that the base layer 19 made of $p^+$-GaAsBi is replaced with a base layer 20 made of $p^+$-GaAsBiN, and the remaining portions are the same as in the first embodiment.

In this configuration, the addition of Bi to GaAs serves to make the lattice constant of the crystal larger than GaAs, although the addition of N (nitrogen) serves to make the lattice constant smaller. This reduces the lattice mismatch between the base layer and the GaAs layer (the collector layer) found in the first embodiment. Thus, it is possible to form a thicker base layer than the base layer made of GaAsBi or to increase the energy level at the valence band edge by increasing the amount of Bi, while the advantages described in the first embodiment are maintained. Consequently, the design of the base layer can be realized with more flexibility, and the composition of the base layer can be easily changed to provide a potential gradient. For example, the amount of Bi in the base layer can be increased toward the collector from the emitter to provide a potential gradient for accelerating the movement of electrons, thereby increasing the moving speed of the electrons from the base layer to the collector layer.

As described above, according to the second embodiment, the base resistance can be reduced similarly to the first embodiment, and the lattice mismatch between the base layer and the collector layer found in the first embodiment can be reduced.

(Third Embodiment)

Figure 3:
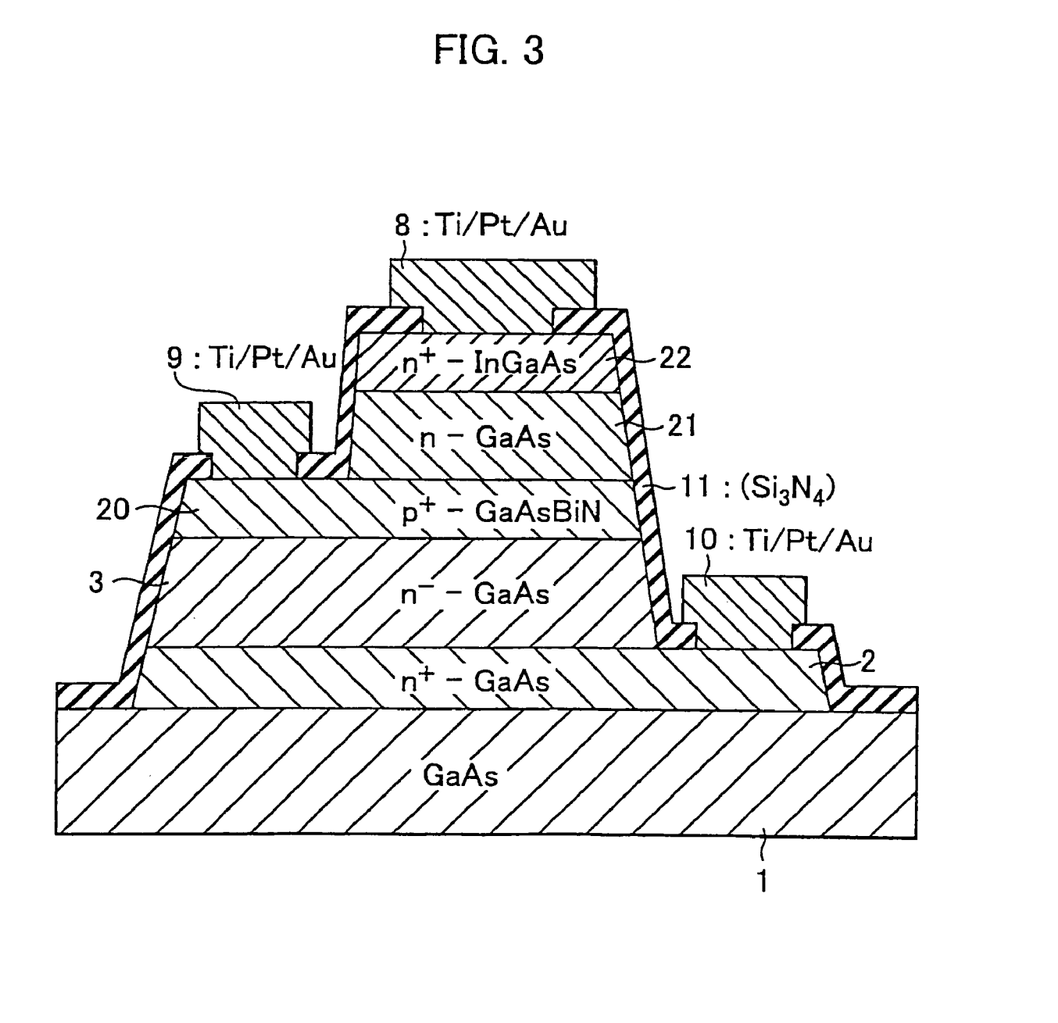
FIG. 3 is a sectional view showing a semiconductor device according to a third embodiment of the present invention.

FIG. 3 shows a semiconductor device according to a third embodiment of the present invention, in which GaAsBiN is used for a base layer, and GaAs is used for an emitter layer. Specifically, the third embodiment differs from the second embodiment in that an emitter layer 21 made of n-GaAs and a cap layer 22 made of $n^+$-InGaAs are successively stacked on the base layer 20 made of $p^+$-GaAsBiN. The remaining portions are the same as in the first and second embodiments.

In the above configuration, as compared with the emitter layer made of InGaP used in the first and second embodiments, the energy at the conduction band edge of the emitter is reduced to lower the turn-on voltage at the emitter-base junction. Thus, the Knee voltage Vk in the $I_c$–$V_{ce}$ characteristics can be reduced. The reduction in the Knee voltage Vk is important since it increases the power added efficiency (PAE) of a power amplifier (PA). The emitter layer made of GaAs is effective because GaAsBiN is used for the base layer in this case. If the base layer is made of GaAs, the emitter layer made of GaAs cannot form an HBT. If InGaAs is used for the base layer, an HBT can be formed, but this configuration is not preferable since a conduction-band offset $\Delta Ec$ is larger than a valence-band offset $\Delta Ev$ at the interface between the emitter layer and the base layer, and a large conduction-band offset $\Delta Ec$ is present at the interface between the emitter layer and the collector (base) layer. When GaAsBiN is used for the base layer, a conduction-band offset $\Delta Ec$ at the interface between the base layer and the GaAs emitter layer can be reduced while a valence-band offset $\Delta Ev$ can be increased. Similar effects can also be achieved when GaAsBi is used for the base layer.

As is apparent from the above description, according to the third embodiment, the base resistance can be reduced and the Knee voltage Vk can be reduced to enhance the power added efficiency (PAE) of the power amplifier (PA) for which the semiconductor device is used.

(Fourth Embodiment)

Figure 4:
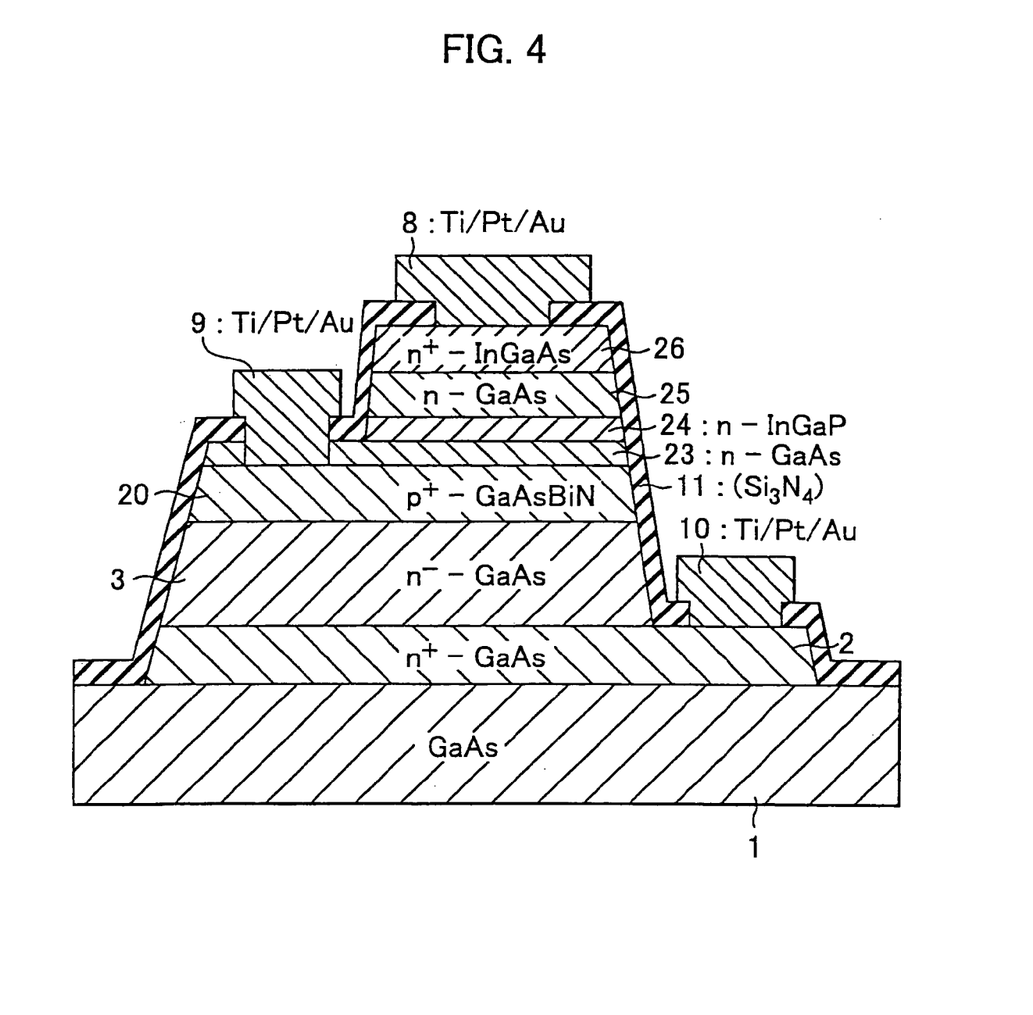
FIG. 4 is a sectional view showing a semiconductor device according to a fourth embodiment of the present invention.

FIG. 4 shows a semiconductor device according to a fourth embodiment of the present invention. The fourth embodiment is a modification of the third embodiment. Specifically, the stack of the emitter layer 21 made of n-GaAs and the cap layer 22 made of $n^+$-InGaAs in the third embodiment are replaced with the stack of a first emitter layer 23 made of n-GaAs that is partially etched near a base electrode 9, an etching stop layer 24 made of n-InGaP, a second emitter layer 25 made of n-GaAs, and a cap layer 26 made of $n^+$-InGaAs.

In the third embodiment shown in FIG. 3, the p-n junction between the emitter and the base is likely to be exposed to the surface at a corner of an emitter mesa, so that the configuration is easily affected by surface recombination. To eliminate this, a portion of the emitter made of GaAs is left. However, etching the portion of the emitter with favorable controllability requires the etching stop layer. Thus, the fourth embodiment employs InGaP as the etching stop layer inserted into the first and second emitter layers made of GaAs.

As described above, according to the fourth embodiment, a portion of the emitter can be etched with favorable controllability to easily form a configuration that prevents exposure of the p-n junction between the emitter and the base at the corner of the emitter mesa.

(Fifth Embodiment)

Figure 5:
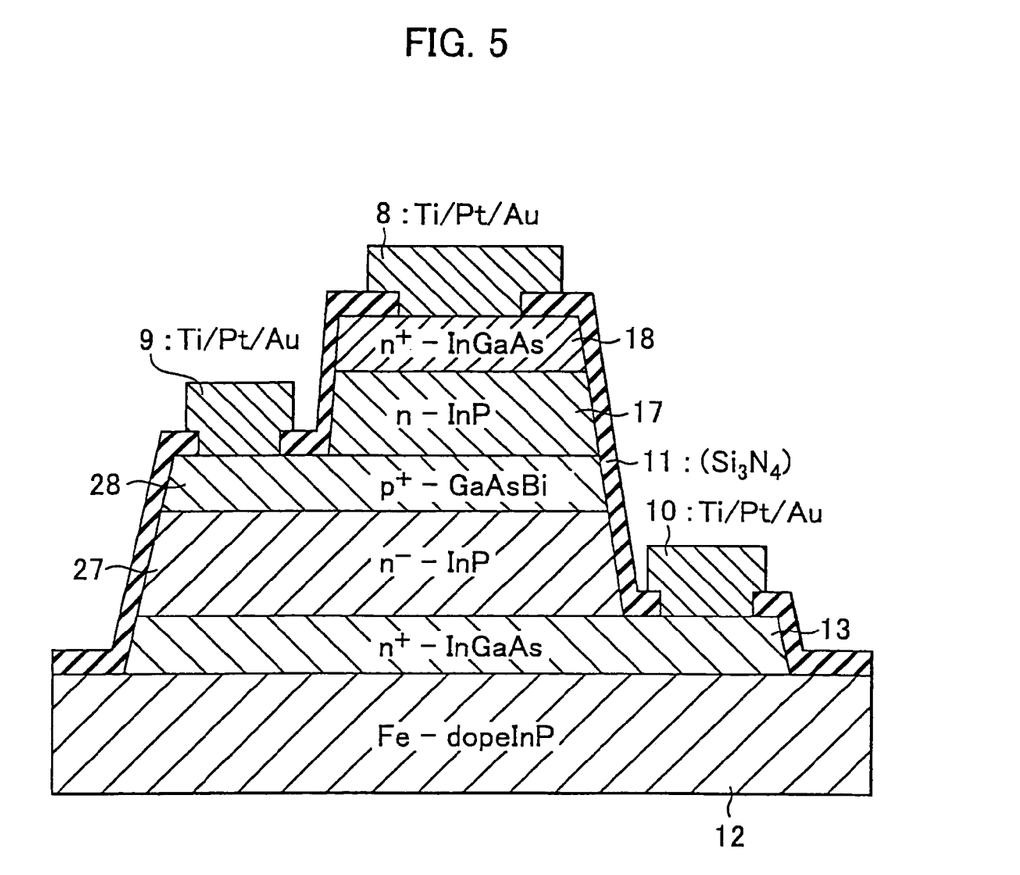
FIG. 5 is a sectional view showing a semiconductor device according to a fifth embodiment of the present invention.

FIG. 5 shows a semiconductor device according to a fifth embodiment of the present invention. The fifth embodiment differs from the conventional InP-based DHBT shown in FIG. 8 in that GaAsBi is used for a base layer and an InP layer is adjacent to the base layer. In FIG. 5, components identical to those in FIG. 8 are designated with the same reference numerals.

As shown in FIG. 5, the semiconductor device of the fifth embodiment includes a subcollector layer 13, made of, for example, $n^+$-InGaAs, a collector layer 27 made of $n^-$-InP, a base layer 28 made of $p^+$-GaAsBi, an emitter layer 17, made of, for example, n-InP, and a cap layer 18 made of $n^+$-InGaAs, which are successively stacked on a substrate 12, made of, for example, a semi-insulating InP.

An emitter electrode 8, made of, for example, Ti/Pt/Au is formed on the cap layer 18. For forming base contact, portions of the emitter layer 17 and the cap layer 18 are removed to form a mesa structure such that a base electrode 9, made of, for example, Ti/Pt/Au, is formed on the base layer 28. A mesa structure is also formed for forming a collector electrode such that the collector electrode 10, made of, for example, Ti/Pt/Au, is formed on the subcollector layer 13. The surface of the semiconductor device that is not in contact with any of the electrodes is covered with an insulating film 11, made of, for example, $Si_3N_4$.

The fifth embodiment is characterized by using GaAsBi for the base layer of the InP-based DHBT. The fifth embodiment has the advantages detailed below as compared with the standard InP-based DHBT shown in FIG. 8. Firstly, since the energy at a valence band edge is increased by the addition of Bi, the Schottky barrier for the base layer is lowered to easily reduce base contact resistance. Secondly, the difference in energy at the valence band edges of the emitter layer and the base layer is increased, so that the effect of confining holes in the base layer can be enhanced. Thirdly, as the atomic number of a Group V element is larger, hole mobility is greater and impurity doping is readily performed at a higher concentration, thereby facilitating a reduction in base resistance. Fourthly, as compared with InGaAs, which is most frequently used as a material of the base layer for the InP-based HBT, GaAsBi provides higher energy at the conduction band edge than InGaAs, and it is possible to reduce the amount of the conduction-band offset $\Delta Ec$ between the base layer and the collector layer. Fifthly, since the amount of the conduction-band offset $\Delta Ec$ found between the base layer and the emitter layer can be reduced similarly, the emitter-base turn-on voltage can be lowered to reduce the Knee voltage Vk.

GaAsBi can be lattice-matched to InP of the collector layer 27 by appropriately selecting the composition. The use of a quaternary compound such as AlGaAsBi or InGaAsBi formed by adding a Group III material such as Al or In to GaAsBi or GaAsSbBi formed by adding Sb to GaAsBi makes it easy to adjust band alignment between the base layer and the emitter layer and the base layer and the collector layer or form a graded structure in the base layer.

As is apparent from the above description, according to the fifth embodiment, as compared with the conventional InP-based DHBT shown in FIG. 8, it is possible to reduce the base resistance, improve the basic performance of the HBT, reduce the Knee voltage Vk, and enhance the power added efficiency of a power amplifier for which the semiconductor device is used.

(Sixth Embodiment)

Figure 6:
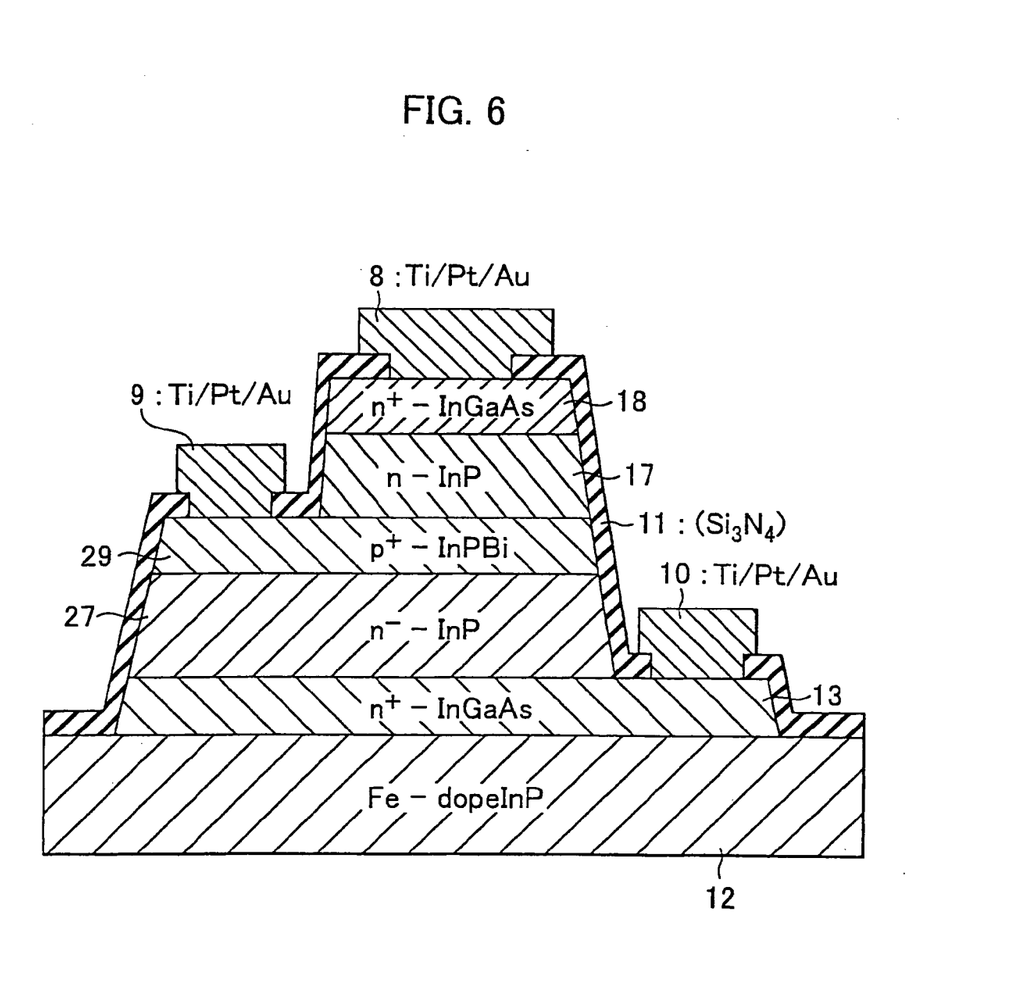
FIG. 6 is a sectional view showing a semiconductor device according to a sixth embodiment of the present invention.

FIG. 6 shows a semiconductor device according to a sixth embodiment of the present invention, in which InPBi is used for a base layer in an InP-based DHBT configuration. In other words, the sixth embodiment differs from the fifth embodiment only in the base layer 29 made of InPBi.

In the above configuration, the addition of Bi to InP makes energy at the valence band edge of the base layer 29 higher than that of an emitter layer 17 made of InP to produce a valence-band offset $\Delta Ev$ between the emitter layer 17 and the base layer 29, thereby presenting an HBT configuration. The emitter layer 17 and the collector layer 27 are made of Inp, and the base layer is formed by adding Bi to Inp, so that the structure is simple so that the HBT may be easily manufactured. Since the Group III element is common to the emitter, the base, and the collector, it is conceivable that the amount of a conduction-band offset $\Delta Ec$ is not large, such that the HBT is also advantageous in reducing the Knee voltage Vk. However, is not lattice-matched to InP, so that the thickness of the base layer must be set to be equal to or smaller than the critical thickness.

As is apparent from the above description, according to the sixth embodiment, it is possible to simplify the configuration, reduce the Knee voltage Vk, and enhance the power added efficiency of a power amplifier for which the semiconductor is used, as compared with the conventional InP-based DHBT shown in FIG. 8. In addition, the effect of reducing the base resistance can be achieved by adding Bi.

What is claimed is:

1. A semiconductor device comprising:
an emitter layer;
a base layer; and
a collector layer, the sum of a band gap and electron affinity of said emitter layer being larger than the sum of a band gap and electron affinity of said base layer, wherein said base layer contains Bi in an amount which provides a potential gradient that increases movement speed of the electrons from the base layer to the collector layer.

* * * * *